(12) United States Patent
Fang et al.

(10) Patent No.: US 11,791,624 B2
(45) Date of Patent: Oct. 17, 2023

(54) OVERVOLTAGE PROTECTION CIRCUIT AND DEVICE

(71) Applicant: Infineon Technologies AG, Neubiberg (DE)

(72) Inventors: Jie Fang, Munich (DE); Heinrich Guenther Heiss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/154,562

(22) Filed: Jan. 21, 2021

(65) Prior Publication Data

US 2021/0226444 A1 Jul. 22, 2021

(30) Foreign Application Priority Data

Jan. 22, 2020 (EP) .................................... 20153136

(51) Int. Cl.
*H02H 9/04* (2006.01)
*H02J 7/00* (2006.01)
*H01L 27/02* (2006.01)

(52) U.S. Cl.
CPC ......... *H02H 9/046* (2013.01); *H02J 7/00308* (2020.01); *H01L 27/0248* (2013.01)

(58) Field of Classification Search
CPC ....... H02H 9/046; H02H 3/20; H02J 7/00308; H01L 27/0248; H03K 17/0822; H03K 17/08142
USPC ................................ 361/91.1, 91.5–91.6, 56
See application file for complete search history.

(56) References Cited

U.S. PATENT DOCUMENTS

| | | | | |
|---|---|---|---|---|
| 5,134,323 A | * | 7/1992 | Congdon | ............. H03K 17/567 327/483 |
| 6,529,355 B1 | * | 3/2003 | Becker | ..................... G01R 1/36 361/101 |
| 6,556,401 B1 | * | 4/2003 | Loewen | ................. H02H 3/202 307/130 |

(Continued)

FOREIGN PATENT DOCUMENTS

| | | | | |
|---|---|---|---|---|
| CN | 102545145 B | * | 8/2016 | ............... H02H 3/20 |
| DE | 10315176 B4 | * | 4/2014 | ......... H01L 27/0266 |

(Continued)

OTHER PUBLICATIONS

CN 102545145; Thompson Rune; System and method for protecting power consumption circuit; Aug. 24, 2016 (Year: 2016).*

(Continued)

*Primary Examiner* — Dharti H Patel

(74) *Attorney, Agent, or Firm* — Murphy, Bilak & Homiller, PLLC

(57) ABSTRACT

Examples relate to an overvoltage protection circuit for a device interface adapted to convey at least electrical energy. The overvoltage protection circuit includes a first and a second terminal and a normally-on transistor. The normally-on transistor is electrically coupled to the first and second terminal. The overvoltage protection circuit further includes a control circuit configured to switch off the normally-on transistor as a function of at least one of a voltage at the first terminal and a voltage at the second terminal. Further examples relate to a device including an interface and an overvoltage protection circuit. The first terminal of the overvoltage protection circuit is electrically coupled to the interface.

22 Claims, 5 Drawing Sheets

(56) References Cited

U.S. PATENT DOCUMENTS

| | | | | |
|---|---|---|---|---|
| 7,965,484 B2* | 6/2011 | Baudesson | ............ | H02M 5/458 361/91.1 |
| 8,879,226 B2* | 11/2014 | Esumi | ................ | H03K 17/0822 361/93.7 |
| 8,982,520 B2* | 3/2015 | Predtetchenski | ... | G06F 13/4072 361/91.5 |
| 9,131,581 B1* | 9/2015 | Hsia | .................... | H05B 45/375 |
| 9,300,223 B2* | 3/2016 | Ikeda | ................. | H01L 27/0605 |
| 10,381,787 B1* | 8/2019 | Bodnaruk | .............. | H02H 3/202 |
| 2003/0214769 A1* | 11/2003 | Nishikawa | ............... | H02H 3/20 361/56 |
| 2009/0079491 A1 | 3/2009 | Kawamura | | |
| 2009/0290276 A1* | 11/2009 | Carcouet | ................ | H02H 9/042 361/93.9 |
| 2009/0323243 A1* | 12/2009 | Morrish | ................. | H02H 9/025 361/101 |
| 2011/0026185 A1* | 2/2011 | Boudet | ............. | H03K 17/6874 361/211 |
| 2013/0128404 A1* | 5/2013 | Tu | .......................... | H02H 3/202 361/86 |
| 2014/0091643 A1 | 4/2014 | Norling | | |
| 2014/0192441 A1* | 7/2014 | Briere | .................... | H02M 1/32 361/18 |
| 2014/0265900 A1* | 9/2014 | Sadwick | .............. | H05B 45/395 315/200 R |
| 2015/0028693 A1* | 1/2015 | Reed | ...................... | H05B 47/11 307/117 |
| 2015/0043117 A1* | 2/2015 | Xiang | ..................... | A24F 40/90 361/91.5 |
| 2016/0043117 A1* | 2/2016 | Guo | ....................... | H01L 27/124 438/158 |
| 2016/0049786 A1* | 2/2016 | Kinzer | ................ | H01L 27/0255 361/91.2 |
| 2016/0141864 A1* | 5/2016 | Mikajiri | ............. | H01L 27/0266 257/369 |
| 2016/0188514 A1* | 6/2016 | Forghani-Zadeh | ......................... | G06F 13/4282 710/313 |
| 2016/0190794 A1* | 6/2016 | Forghani-Zadeh | .... | H02H 9/045 361/86 |
| 2019/0199084 A1* | 6/2019 | Bahl | .................. | H03K 17/0822 |
| 2019/0354163 A1 | 11/2019 | Bodnaruk et al. | | |
| 2021/0111578 A1* | 4/2021 | Ou | .......................... | G06F 1/266 |

FOREIGN PATENT DOCUMENTS

| | | | | |
|---|---|---|---|---|
| JP | 2014050179 A | | 3/2014 | |
| WO | WO-2013120096 A1 * | | 8/2013 | ............. H02H 3/021 |

OTHER PUBLICATIONS

EP3425800; Al Kayal Fisal; Title: Switching device for SiC or GaN mosfet transistor with overvoltage protection circuit and associated method (Year: 2018).*

* cited by examiner

OVERVOLTAGE PROTECTION CIRCUIT AND DEVICE

TECHNICAL FIELD

Examples relate to an overvoltage protection circuit, e.g., for a device interface adapted to convey at least electrical energy. Further examples relate to a device which may comprise an interface for conveying at least electrical energy and an overvoltage protection circuit.

BACKGROUND

In customer electronic devices, e.g., mobile phones, interfaces are provided to enable at least power supply for charging the device. For example, both power supply and data exchange may be enabled via a common interface or connection. Such interfaces, e.g., data and power supply interfaces, can enable a synchronization of the device while at the same time charging the device, for example.

For example, quick charging or fast charging through USB type-C interface to consumer devices is becoming more and more popular today. As an example, a USB-Power Delivery (PD) protocol for quick charging can support up to 20 V charging voltage. However, not all devices may be configured to be charged using such high voltage supply. Consequently, some devices may need overvoltage protection (OVP), e.g., to avoid damage of the device due to a high voltage (e.g., 20 V) charger. Further, overvoltage protection to a configuration channel (CC) pin of USB type-C interface may be necessary in USB Power Delivery applications.

The configuration channel pin (e.g., CC contact) in such USB type-C interface may have the risk to contact high charging voltage (e.g., due to a short between the CC pin and a power supply pin) and may result in a possible damage. The configuration channel pin is neighbor to the power charging VBUS pin with a small pin pitch (e.g., 0.5 mm) and the voltage tolerance of the configuration channel pin controller chip is for example only 6 V. For example, when short-to-VBUS arises, there may be a need to protect the configuration channel pin from high voltage. For example, as a worst-case scenario, the highest charging voltage of 20 V plus a ring effect can result in a voltage as high as 40 V at the configuration channel pin.

In a normal operation mode, the configuration channel pin may be used for a DC-coupled bidirectional device connection orientation detection, for example also in a dead battery scenario, or for 5 V/1 W power supply to an external connected device (VCONN function), for example.

There are overvoltage protection devices for device interfaces, however known concepts may be complex and inefficient, for example.

SUMMARY

There may be a need for improved concepts relating to overvoltage protection for device interfaces.

An example relates to an overvoltage protection circuit for a device interface adapted to convey at least electrical energy. The overvoltage protection circuit comprises a first terminal and a second terminal. The overvoltage protection circuit further comprises a normally-on transistor. A drain contact of the normally-on transistor is electrically coupled to the first terminal and a source contact of the normally-on transistor is electrically coupled to the second terminal. Further, the overvoltage protection circuit comprises a control circuit configured to switch off the normally-on transistor as a function of at least one of a voltage at the first terminal and a voltage at the second terminal.

An example relates to a device comprising an interface for conveying at least electrical energy and an overvoltage protection circuit. The first terminal of the overvoltage protection circuit is electrically coupled to the interface. Due to the provided overvoltage protection circuit, the interface of the device may be efficiently protected from overvoltage.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
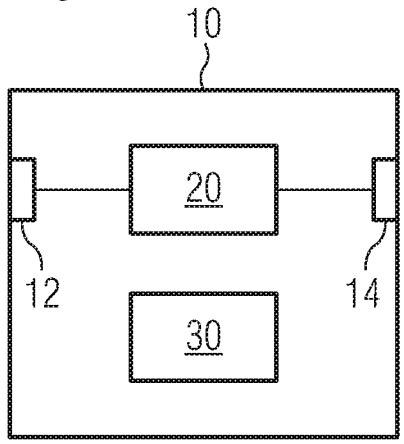
FIG. 1 shows a schematic example of an overvoltage protection circuit.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e., only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

For providing overvoltage protection for a device interface adapted to convey at least electrical energy, e.g., an interface configured for both data transmission and power supply like a USB type-C interface, different options may be used. For example, a first option for overvoltage protection of the configuration channel pin may be using an active switch. For example, the active switch may open a connection between the configuration channel pin and a controller which has to be protected from overvoltage, if a voltage above a voltage threshold is detected. Such active switch may require additional power supply, e.g., it may consume power from a battery. Further, complex control logic may be required when battery is out-of-power (e.g., during a dead battery scenario). A power supply trace may introduce further PCB design complexity. Further, an active switch may require high voltage off-chip capacitor to lower down the ring effect.

A second option for overvoltage protection of the configuration channel pin may be using a Zener diode. If the overvoltage protection event cannot be removed in a short time, a huge Zener diode may have to be considered, for example. For example, the dissipated power may damage the Zener diode itself. Furthermore, the generated heat may damage the PCB, for example.

In the following, improved concepts for overvoltage protection (OVP) for a device interface are described.

FIG. 1 shows a schematic example of an overvoltage protection circuit 10 for a device interface adapted to convey at least electrical energy. The overvoltage protection circuit 10 comprises a first terminal 12 and a second terminal 14. The overvoltage protection circuit 10 further comprises a normally-on transistor 20, wherein a drain contact of the normally-on transistor 20 is electrically coupled to the first terminal 12 and a source contact of the normally-on transistor 20 is electrically coupled to the second terminal 14. Further, the overvoltage protection circuit 10 comprises a control circuit 30 configured to switch off the normally-on transistor 20 as a function of at least one of a voltage at the first terminal 12 and a voltage at the second terminal 14. For example, it may be possible to use only the voltage at the first terminal 12 for controlling the normally-on transistor 20 via the control circuit 30.

By providing the proposed overvoltage protection circuit 10, a device comprising the device interface may be efficiently protected from overvoltage. The device, e.g., a portable device, may be charged via the device interface. When applying a voltage (e.g., a supply voltage, e.g., charging voltage) at the device interface which is detected as potentially dangerous, e.g., as being detected as higher than an allowed maximal voltage, the normally-on transistor 20 may be switched off to electrically isolate components of the device from the applied voltage (e.g., overvoltage), e.g., in order to protect these components from damage due to overvoltage. The overvoltage protection circuit 10 may be used for any device comprising a device interface independent of a design of the device, thus resulting in high flexibility for using the overvoltage protection circuit 10.

The normally-on transistor 20 may enable an electrical connection between the first terminal 12 and the second terminal 14 without a need of external power supply, for example. The overvoltage protection circuit 10 may also function in cases, when no power can be provided for the overvoltage protection circuit 10 by the device, e.g., when an energy storage of the device comprising the device interface is empty. Consequently, the empty energy storage of the device may be charged via the interface while the device may be protected from overvoltage by the overvoltage protection circuit 10 at the same time.

The normally-on transistor 20 may have a low forward resistance $R_{on}$, for example, resulting in low power losses of the overvoltage protection circuit 10. Further, the overvoltage protection circuit 10 may work without need of control signals or power supply other than the voltage at the first terminal 12 and/or the voltage at the second terminal 14. For example, the overvoltage protection circuit 10 may be a 3-terminal circuit having only the first terminal 12, the second terminal 14 and a reference voltage terminal (e.g., ground terminal). The overvoltage protection circuit 10 may be described as passive device or passive component, for example. The overvoltage protection circuit 10 may provide effective overvoltage protection e.g., by means of the normally-on transistor 20 and the control circuit 30 only, thus without the need of a complex circuit design or control logic, for example.

For example, the device interface may be configured to convey electrical energy and further data (e.g., at least one data signal). For example, the device interface may be a data and power interface. For example, it is possible to electrically connect the first terminal 12 of the overvoltage protection circuit 10 to a power supply contact of the device interface to protect components of the device electrically connected to the second terminal 14 when a supply voltage higher than the voltage threshold is applied to the device interface. Alternatively or additionally, the overvoltage protection circuit 10 may be used for contacting a data signal contact of the device interface, e.g., to protect components of the device configured to receive the data signal from the supply voltage of the device interface, e.g., in case of an electrical connection between the power supply contact and the data signal contact of the device interface.

For example, the normally-on transistor 20 may be a gallium nitride (GaN) transistor. The GaN transistor may be a GaN high electron mobility transistor (HEMT). For example, a depletion mode GaN HEMT provides a conducting channel between its drain- and source-contact, due to the intrinsically gathered two-dimensional electron gas (2DEG) of the transistor. A breakdown voltage of a GaN device, e.g., the GaN transistor, may be higher than a breakdown voltage of a silicon Si device. Hence the normally-on transistor 20 may be provided in a smaller dimension (e.g., compared to a Si transistor), e.g., with a low on-state resistance. By providing the overvoltage protection 10 with a reduced number of components and a small normally-on transistor 20, e.g., the overvoltage protection circuit 10 may be small and suitable for protection of device interfaces of portable devices, for example. Alternatively, the normally-on transistor may be a depletion mode silicon field effect transistor.

As discussed above, the control circuit 30 is configured to switch off the normally-on transistor 20 as a function of the voltage at the first terminal 12 and/or the voltage at the second terminal 14. For example, the control circuit 30 may be configured to switch off the normally-on transistor 20 if a voltage at the first terminal 12 and/or at the second terminal 14 reaches or rises above a voltage threshold. For example, the overvoltage protection circuit 10 may be used in a device providing the device interface for charging components of the device. The device may be configured to be charged using voltages up to a maximal allowed voltage, e.g., 5 V. Consequently, the voltage threshold for controlling the normally-on transistor 20 may be set depending on the maximal allowed voltage (e.g., equal to or lower than the maximal allowed voltage). For example, the voltage threshold may be at least 5 V (or at least 5.5 V) and/or at most 6.5 V (or at most 6 V, or at most 5.5 V).

For example, the control circuit 30 may comprise a voltage detection circuit configured to provide a detection signal having a voltage level depending on whether the voltage at the first terminal or second terminal is above or below the voltage threshold. For example, the voltage detection circuit may comprise circuitry generating the detection signal when the voltage at the first terminal or second terminal rises above the threshold. For example, a voltage sensor may be used for sensing the voltage at the first terminal or second terminal. The signal of the voltage sensor may be compared with the threshold value and the detection signal may indicate events when the measured signal is at least equal to the voltage threshold.

The voltage detection circuit may comprise a diode and a voltage divider connected in series. For example, the detection signal may be provided by the voltage divider. The diode, e.g., a Zener diode, may come in a conductive state when the voltage at the first terminal 12 and/or the second terminal 14 reaches the voltage threshold. For example, a breakdown voltage of the diode may be selected according to the voltage threshold. The electrical current through the diode and the voltage divider in the conductive state of the diode results in an electrical potential at the voltage divider which may be used as detection signal, for example.

For example, the voltage detection circuit may be configured to measure the voltage at the first terminal 12 and/or the second terminal 14, e.g., by a voltage sensor of the voltage detection circuit. The voltage detection circuit may be configured to provide an adjustable voltage threshold. For example, the voltage threshold may be set using a control signal received via a control interface of the overvoltage protection circuit 10 and a controller of the overvoltage protection circuit 10 (e.g., Inter-Integrated Circuit I2C or Mobile Industry Processor Interface MIPI). The controller may adjust a voltage reference, for example, to enable adjusting the voltage threshold. For example, an overvoltage sensing and trigger function may be implemented by providing a voltage divider (e.g., one pair of electrical resistors), a comparator and the voltage reference VREF. As described, the VREF level may be set through the control interface, e.g., a digital interface. The voltage divider may divide the voltage at the first terminal 12 and/or the second terminal 14 and the divided voltage signal may be provided at the comparator. The comparator may be configured to compare the divided voltage with the voltage reference. If the divided voltage is higher than the voltage reference (VREF), the comparator may generate or output the detection signal.

Providing an adjustable voltage threshold may result in higher flexibility for using the overvoltage protection circuit 10. For example, the control interface may receive a control signal from the device comprising the device interface to adjust the voltage threshold according to the specific device. For example, the overvoltage protection circuit can be used in different devices using different charging voltages.

For example, the control circuit may comprise a transistor for controlling a gate of the normally-on transistor. A collector or a drain of the transistor (e.g., a bipolar transistor or a field effect transistor) may be electrically coupled to the gate of the normally-on transistor. For example, the control circuit may consist of the transistor, e.g., resulting in a low complex design of the control circuit. The control circuit may be configured to receive the detection signal of the voltage detection circuit, e.g., to control the normally-on transistor 20 based on the detection signal. For example, the voltage detection circuit may be configured to provide the detection signal to a base or a gate of the transistor. When overvoltage occurs, the detection signal may cause a conductive state of the transistor of the control circuit, for example. In other words, the detection signal may be used as signal for controlling the transistor of the control circuit. For example, the overvoltage protection circuit 10 may be referred to as a passive device as for its function there might be no need for external control signals in addition to the voltage at the first terminal 12 and/or the second terminal 14. The conductive transistor of the control circuit may cause an electrical connection of the gate of the normally-on transistor 20 to ground. Consequently, the normally-on transistor 20 may be switched off when the voltage detection circuit signals an overvoltage condition.

For example, the second terminal 14 of the overvoltage protection circuit 10 and the gate of the normally-on transistor 20 may be electrically coupled via a resistor. For example, in an overvoltage event, the normally-on transistor 20 may conduct a small amount of current which flows through the resistor and through the control circuit 30 to the ground, e.g., to stabilize the voltage at the source contact of the normally-on transistor 20 and the second terminal 14. For example, a remaining voltage at the source contact and the second terminal 14 may be close to a threshold voltage of the normally-on transistor 20, e.g., GaN HEMT, being lower than the voltage threshold at which the normally-on transistor 20 may be switched off. For example, the overvoltage protection circuit 10 may be configured to limit an output voltage at the second terminal 14 to a maximal voltage of e.g., at most 4 V (or e.g., at most 3 V) if an input voltage at the first terminal 12 exceeds the voltage threshold.

For example, the normally-on transistor 20 and the control circuit 30 may be implemented on a common semiconductor die and/or in a common semiconductor package. For example, it may be possible to integrate both the GaN HEMT (e.g., the normally-on transistor 20) and a silicon-based transistor (e.g., used in the control circuit 30 and/or the voltage detection circuit) in one common chip (e.g., by using GaN-Si technology). The silicon-based components may be implemented with either a CMOS process or a bipolar process, for example. Using both GaN technology and Si technology for forming the overvoltage protection circuit 10 may result in high performance and small size of the overvoltage protection circuit 10 due to the GaN based normally-on transistor 20 and lower costs of the overvoltage protection circuit 10 due to the less expensive Si based components, for example.

For example, the overvoltage protection circuit 10 may further comprise at least one of an electrostatic discharge protection diode at the first terminal 12 and/or an electrostatic discharge protection diode at the second terminal 14. For example, ESD protection may be more relevant at the second terminal 14 compared to the first terminal 12. The electrostatic discharge protection diode may have a breakdown voltage of at least 10 V (or at least 20 V, or at least 30 V).

As already mentioned, the overvoltage protection circuit 10 may be used in devices with a device interface that may be used at least for transfer of electrical energy, in order to protect components of the device from damage due to overvoltage. The following example relates to a device with an overvoltage protection circuit 10.

In some embodiments, in addition to the voltage at terminal 12 and/or 14, the control circuit 30 may take into account one or more other parameter to determine whether to turn-off the normally-on transistor 20. The parameter(s) may be a temperature, a duration, e.g., a duration for which the voltage in question remains above or below a certain value which may or may not correspond to the threshold in question, a level of humidity of the device or of the environment of the device, a level of radiation to which the device is subjected such as infrared light. The determination of whether to turn-off the normally-on transistor may be carried out based on a set of conditions each involving a single or a plurality of the parameters and the voltage at terminal 12 and/or 14, conditions which have to be simultaneously verified for the transistor to be switched off. Alternatively, the determination may be carried out by computing the value of a predetermined indicator which incorporates all the considered parameters and voltage(s) and further comparing this value to a threshold.

Figure 2:
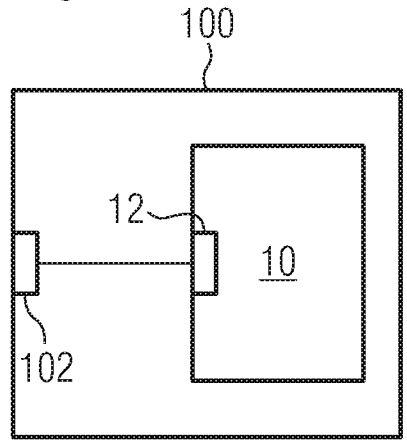
FIG. 2 shows a schematic example of a device comprising an overvoltage protection circuit.

FIG. 2 shows a schematic example of a device 100 comprising an overvoltage protection circuit 10. The device 100 further comprises an interface 102 for conveying at least electrical energy. The first terminal 12 of the overvoltage protection circuit is electrically coupled to the interface 102.

For example, the second terminal 14 of the overvoltage protection circuit 10 may be electrically coupled to further components of the device 100 (e.g., a controller) which are to be protected from overvoltage.

The interface 102, e.g., the device interface, may be configured for conveying both electrical energy and data. For example, the interface 102 may be described as power and data interface. Such interfaces are commonly used in portable devices such as mobile phones, e.g., to provide both data transfer and charging the mobile device via one single interface or plug.

For example, the interface 102 may be a Universal Serial Bus USB interface. The device 100 may further comprise a Universal Serial Bus USB controller and the second terminal 14 of the overvoltage protection circuit 10 may be electrically coupled to the USB controller. For example, the overvoltage protection circuit 10 may be electrically connected to a data contact (e.g., a data pin) of the interface 102. The USB interface may provide a power supply voltage via a power supply pin which would damage the USB controller, for example. The overvoltage protection circuit 10 may protect the USB controller from the power supply voltage, e.g., when a short between the data pin and the power supply pin occurs (e.g., due to a damaged USB plug).

The device 100 may be configured for applying a maximal power supply voltage of at least 15 V (or at least 20 V) and/or at most 30 V at the power supply pin. For example, the device 100 may be a USB type-C compatible device. For example, the Universal Serial Bus controller may be a Universal Serial Bus type-C controller and the interface 102 may be a Universal Serial Bus type-C interface adapted for conveying both electrical energy and data. USB type-C interfaces may provide power supply voltages up to 20 V, for example, which may damage the USB type-C controller. For example, the first terminal 12 of the overvoltage protection circuit 10 may be electrically coupled to a Configuration Channel pin of a USB type-C connector of the USB compatible device.

For example, the pins of a USB type-C plug are close to each other so that there is increased risk that the power supply pin and the data pin are electrically connected unintentionally. For example, a smallest distance between the data pin and the power supply pin may be at most 2 mm (or at most 1 mm, or at most 0.5 mm).

Alternatively or additionally, the first terminal 12 of the overvoltage protection circuit 10 may be coupled to the power supply pin of the interface 102 and the second terminal 14 of the overvoltage protection circuit 10 may be coupled to a charging electronic of the device 100. For example, the device is a USB compatible device configured to be charged using voltages lower than other USB compatible devices (e.g., less than 10 V, e.g., 5 V). For example, when connecting a USB type-C charger providing 20 V, the charging electronic could be damaged without means of overvoltage protection. Therefore, the overvoltage protection circuit 10 coupled to the power supply pin may use a voltage threshold of less than 10 V (e.g., of at most 11 V, at most 10 V, at most 6 V or at most 5 V) to protect the charging electronic from overvoltage due to usage of an inappropriate charger for the device (for example a so-called fast charger).

For example, the USB controller and the overvoltage protection circuit 10 may be implemented on a common semiconductor die and/or in a common semiconductor device package. Thus, integrated overvoltage protection may be provided for the controller (e.g., USB controller), for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g., FIGS. 1 and 3-5).

Figure 3:
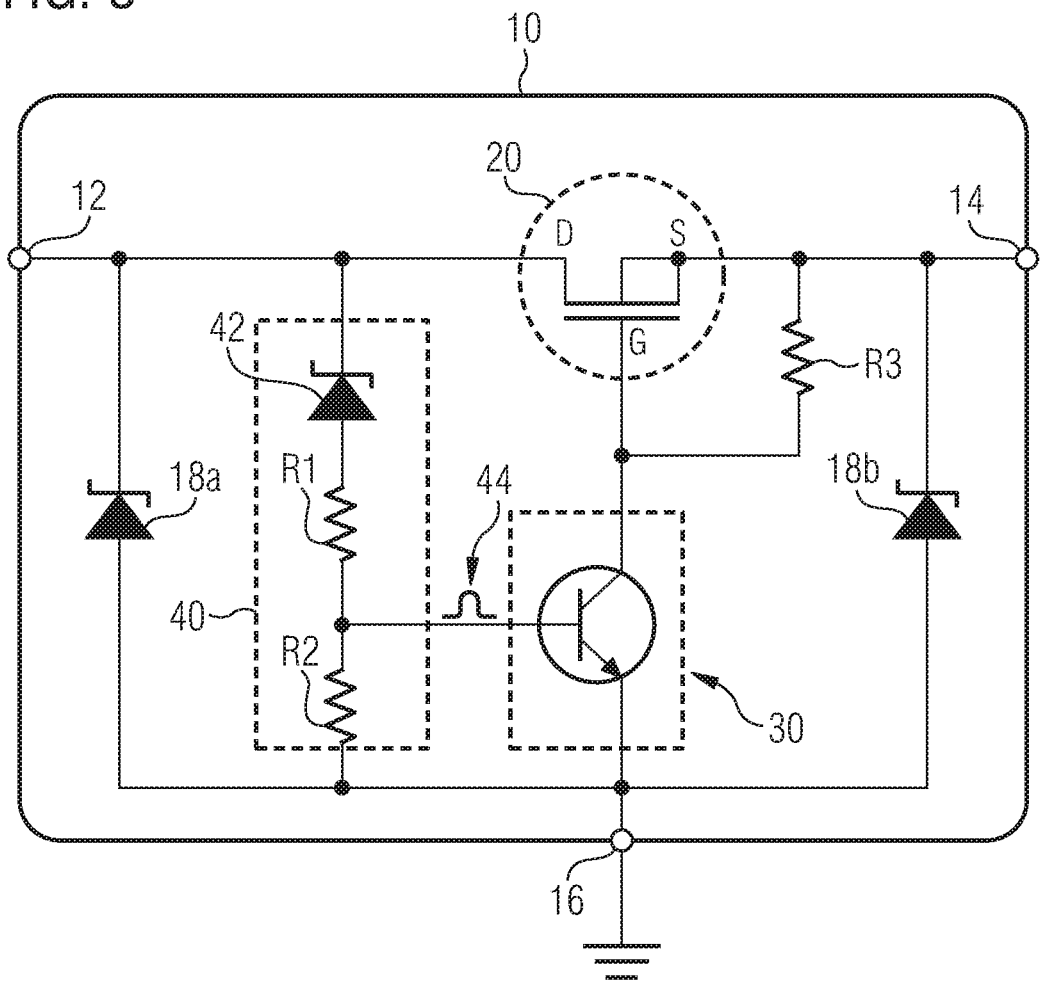
FIG. 3 shows an exemplary circuit design of an overvoltage protection circuit.

FIG. 3 shows an exemplary circuit design of an overvoltage protection circuit 10. The normally-on transistor 20 is implemented as GaN HEMT with a drain contact D coupled to the first terminal 12, a source contact S coupled to the second terminal 14, and a gate contact G coupled to the control circuit 30. The control circuit 30 is implemented by a bipolar transistor with a collector coupled to the gate contact G, an emitter coupled to a ground contact 16 of the overvoltage protection circuit 10 and a base contact coupled to a voltage detection circuit 40 of the overvoltage protection circuit 10, as an example.

The voltage detection circuit 40 comprises a diode 42, e.g., a Zener diode, and a voltage divider comprising a first resistor R1 and a second resistor R2. The voltage detection circuit 40 is configured to provide a divided voltage of the voltage divider as a detection signal 44 to the control circuit 30.

The source contact S and the gate contact G of the normally-on transistor 20 are electrically coupled via a third resistor R3. Further, between both terminals 12, 14 and the ground contact 16, electrostatic discharge protection diodes 18*a*, 18*b* are provided, e.g., having a breakdown voltage of at least 20 V (e.g., ESD diodes).

The normally-on transistor 20 may be a GaN HEMT and provide the core of the overvoltage protection circuit 10. The depletion mode GaN HEMT provides a conducting channel between its drain- and source-node, owing to the intrinsically gathered two-dimensional electron gas (2DEG), which may benefit to a low $R_{ON}$ compared to a Si device, for example. The 2DEG may be controlled by the voltage applied between the gate- and source-nodes (e.g., the gate contact G and the source contact S). When the applied voltage is larger than the threshold voltage VTH, the 2DEG will be pinched off, and the device (e.g., normally-on transistor 20) will not conduct current any more, for example.

A die dimension of a GaN device may be much smaller than a Si device to sustain the same voltage level, owing to the much higher break-down field of GaN material. The above-mentioned features of GaN HEMT may be used for VBUS (e.g., power supply pin) OVP applications. The function blocks of over voltage detection (e.g., voltage detection circuit 40) and GaN HEMT controller (e.g., control circuit 30) may be required to control the GaN HEMT. The function of over voltage detection and GaN HEMT controller may be realized by a CMOS process or a bipolar Si process.

For example, during normal operation (e.g., voltage at the first terminal 12 and/or second terminal 14 lower than voltage threshold) the GaN HEMT controller (e.g., transistor of the control circuit 30) is off. The gate-, source- and drain-nodes of the GaN HEMT may have the same voltage potential. Hence, the drain- and source-nodes are connected with a low $R_{ON}$, providing a bi-directional conducting path. Even in a dead battery scenario the GaN HEMT may provide the connection between drain D and source S. In a VCONN mode, the GaN HEMT allows the power from USB controller going through to the external connected device, for example. For example, the on-resistance between the first and second terminals 12, 14 may be around 0.7Ω, when the voltage applied to the terminals is less than 5.8 V. For example, the circuit may conduct a current of less than 500 mA (e.g., less than 200 mA) from first terminal 12 to second terminal 14 with a 5 V power supply at the first terminal 12 and a 24.5Ω load at the second terminal 14. Vice versa, the circuit may conduct a current of less than 500 mA (e.g., less than 200 mA) from the second terminal 14 to the first terminal 12 with a 5 V power supply at the second terminal 14 and e.g., a 24.5Ω load at the first terminal 12 for a VCONN mode operation, for example.

For example, during an overvoltage event, the over voltage detector (e.g., composed of a Zener diode and resistors; e.g., the voltage detection circuit 40) automatically triggers the GaN HEMT controller (e.g., control circuit 30) and connects the gate-node G of the GaN HEMT to ground 16. The voltage difference between the gate- and source-nodes pinches the intrinsic 2DEG of the GaN HEMT. In this case, the GaN HEMT acts as a voltage-controlled resistor. For example, a very small amount of electrical current may run from the drain-node D to the source-node S through the pinched 2DEG and further through R3 to the ground 16 to stabilize the voltage at the source-node S. The remaining voltage at the source-node S may be close to the voltage threshold VTH of the GaN HEMT, which is e.g., less than 3 V. As a result, the GaN HEMT may isolate an input overvoltage (e.g., at the first terminal 12) to a voltage level less than 3 V. Hence, e.g., a USB controller chip may be protected. The OVP may be triggered when the voltage at the first terminal 12 reaches 5.8 V, for example. The voltage at the second terminal 14 may stay around 2.9 V, when the voltage at the first terminal 12 varies between 5.8 V and 20 V, for example.

For example, there might be no thermal issue in the OVP scenario due to very low power dissipation. The resistors may limit the current consumption and the total dissipated power of the whole circuitry may be less than 10 mW, for example.

A transient voltage suppression TVS diode (e.g., electrostatic discharge protection diodes 18a) at the drain-node D acts as a system level protection, while a TVS diode (e.g., electrostatic discharge protection diodes 18b) at the source-node S is a uni-directional device to further protect the gate-source barrel of the GaN HEMT from an ESD event, for example.

As an alternative, a depletion-mode Si-based MOSFET may be used instead of the GaN HEMT as the core device, e.g., as normally-on transistor 20. The functionality with a depletion-mode Si-based MOSFET is similar as that of the GaN HEMT. The proposed concept does not require a bias voltage or power supply for the overvoltage protection circuit, for example.

The overvoltage protection circuit 10 may be used for overvoltage protection of controller chips, e.g., USB controllers. Though, the proposed concepts are independent of such USB controller chipsets. Therefore, the overvoltage protection circuit may be used for existing USB controller chipsets independently from the controller design, for example. However, the concept may be used for a complete controller solution including interface protection, for example.

Quick charging through USB type-C interface is faster and more efficient compared to other charging methods, for example, however, OVP of the cc pin (Configuration Channel pin) may be required. The cc pin OVP concept e.g., adopts the high voltage feature from the GaN device instead of high-power advantages. Hence, a small die periphery may be sufficient. Further, a VBUS OVP concept may be required, since e.g., not all mobile phones are compatible to a 20 V fast charging voltage. A residual high charging voltage or a wrong charger may damage a 5 V-only charging port, for example. The overvoltage protection circuit 10 may be used for such application scenario due to a GaN device with relevant features of high voltage and high power, together with low RON, for example.

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g., FIGS. 1-2 and 4a-5).

FIG. 4 a-c show examples of overvoltage protection circuits 10a, 10b, 10c with an integrated gallium nitride-silicon chip. The normally-on transistor 20 may be implemented using GaN technology, while a silicon-based part 50 (e.g., comprising the other components of the integrated circuits) may be implemented using Si based technology. Thus, a fully integrated GaN-Si chip may be used for implementing the overvoltage protection circuits 10a, 10b, 10c.

The overvoltage protection circuits 10a, 10b, 10c comprise diodes 42a, 42b and 48 for threshold setting and voltage relaxation, e.g., instead of a Zener diode 42. The resistors R1, R2 form a voltage divider and may further be used for current limiting. In series to ground, an overvoltage trigger component 48 is provided (e.g., an on-chip thyristor structure). An overvoltage sensing component 46 is provided between the voltage divider R1, R2 and the control circuit 30. The control circuit 30 may be implemented by a single controlled switch SW, e.g., a transistor. The ESD diode 18a may be an on chip ESD diode, and the ESD diode 18b may be a uni-directional ESD diode, for example.

In case of overvoltage condition, an on-chip thyristor (e.g., trigger component 48) may be triggered. Hence, a small current flows through the diode 42a, 42b—resistor R1, resistor R2—thyristor 48 path, generating a voltage drop across resistor R2. The voltage drop across resistor R2 may activate the OVP sensing function (e.g., sensing component 46), which sets the controlled switch (e.g., control circuit 30) to ON status, for example, and connects the gate G of GaN HEMT (e.g., normally-on transistor 20) to ground 16. Then, the GaN HEMT may block the over-voltage from the first terminal 12 to the second terminal 14.

The overvoltage threshold may be adjusted by on-chip thyristor 48 design itself and the stacked diodes 42a, 42b, for example. Meanwhile, the diodes 42a, 42b may relax a high voltage stress to the rest of the circuit 10a, 10b, 10c.

In normal operation, the on-chip thyristor 48 is open, while the OVP sensing component 46 has a very high input impedance to ground 16, for example. Hence, no current flows into diode 42a, 42b—resistor R1 path. On the other part, a controlled SW (e.g., switch; e.g., control circuit 30) is OFF, and no current flows through resistor R3. Hence, the internally connected first terminal 12 and second terminal 14 through the GaN HEMT may present a very high equivalent impedance to ground 16 and there might be no impact on the resistor configurations outside of the chip. On chip ESD structures 18a, 18b at first terminal 12 and second terminal 14 protect the chip from ESD events, for example.

GaN-Si technology has the possibility to integrate both GaN HEMT and the Si part into one chip, for example. The Si part (e.g., silicon-based part 50) may be implemented with either CMOS process or bipolar process. Diode configuration (e.g., diodes 42a, 42b) is common in both CMOS and bipolar process, for example. The thyristor (e.g., trigger component 48) is a combination of P-regions and N-regions from on-chip ESD structure, for example, which is available in both CMOS and bipolar processes. The OVP sensing (e.g., implemented by sensing component 46) can be a very simple transistor configuration in both processes. The controlled SW (e.g., control circuit 30) can be a single transistor in both processes, for example.

Figure 4A:
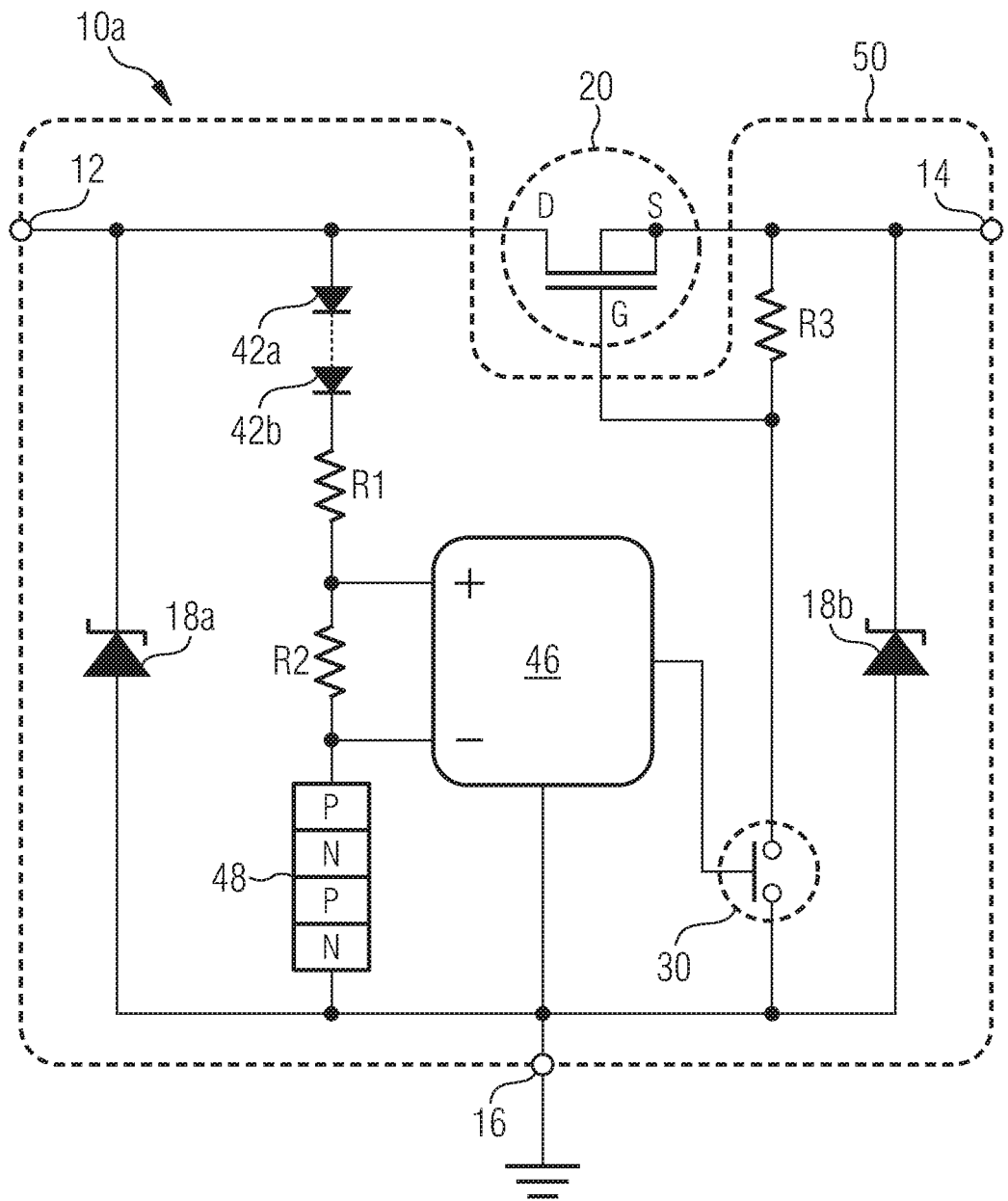
FIG. 4 *a-c* show examples of the overvoltage protection circuit with an integrated gallium nitride-silicon chip.
Figure 4B:
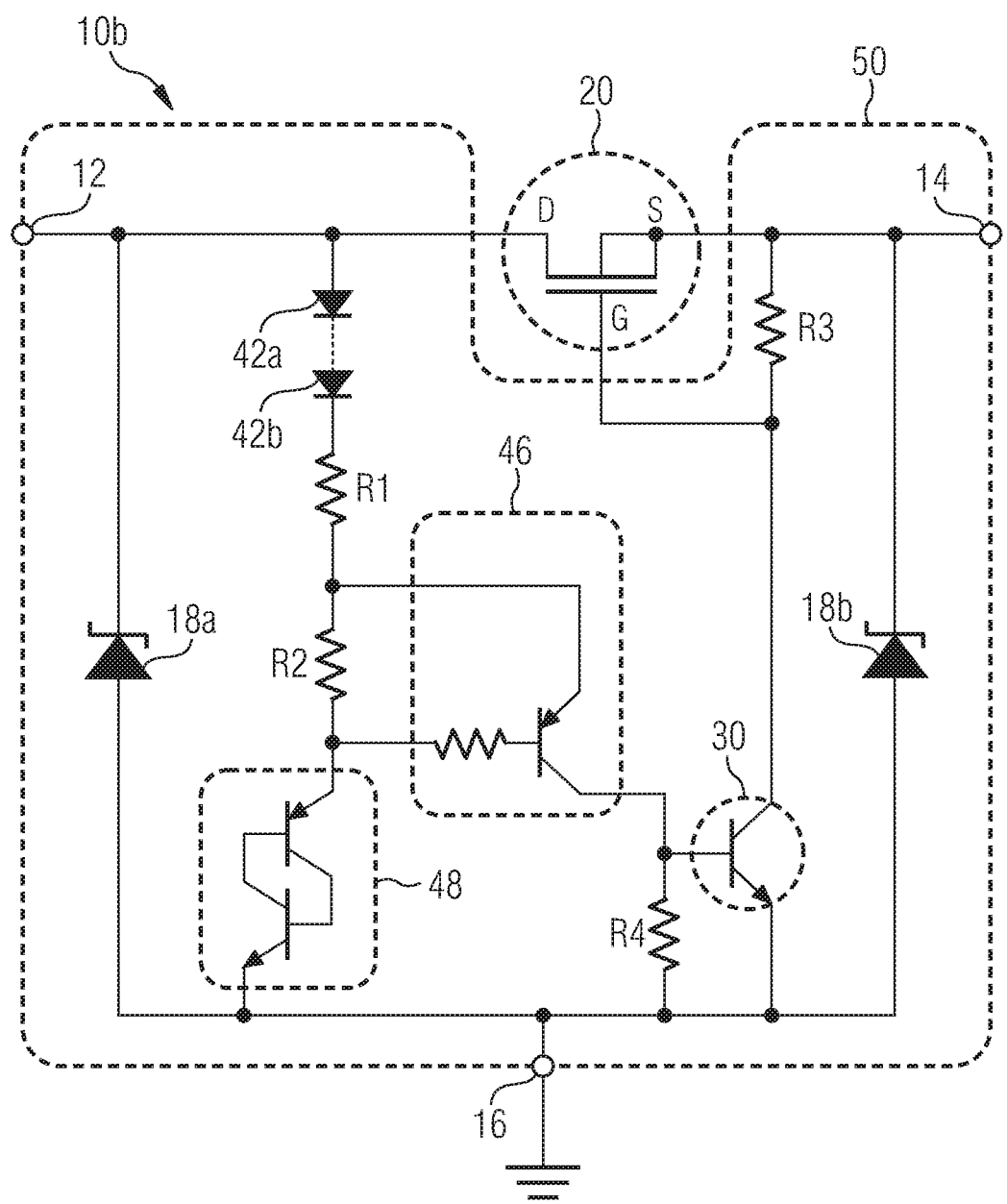
Figure 4C:
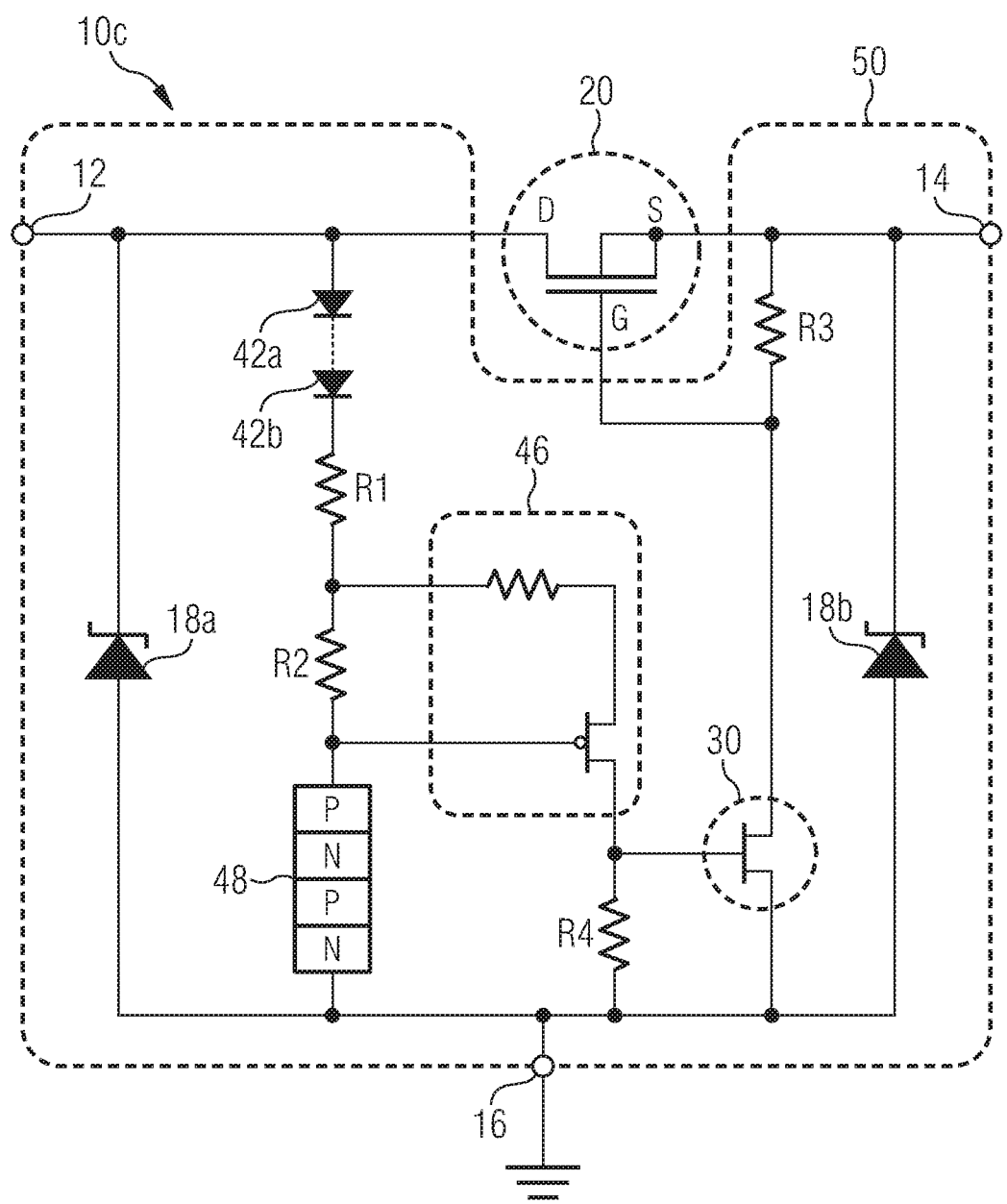

FIGS. 4b and 4c show examples of overvoltage protection circuits with alternative voltage sensing concepts. In FIG. 4b, an integrated circuit, e.g., the overvoltage protection circuit 10b with bipolar-based silicon part 50 is shown. The sensing component 46 comprises a bipolar transistor with an emitter coupled to the voltage divider between resistor R1 and resistor R2, and with a base coupled between the voltage divider and the trigger component 48 via a resistor. A collector of the bipolar transistor is coupled to the control circuit 30 for providing the detection signal, and to ground 16 via a resistor R4.

In FIG. 4c an integrated circuit with CMOS-based silicon part is shown. The control circuit comprises a metal-oxide-semiconductor field-effect transistor MOSFET, e.g., an n-channel MOSFET. The sensing component 46 comprises a p-channel MOSFET with a gate coupled to the trigger component 48. For example, different semiconductor technologies may be usable for forming overvoltage protection circuits 10, 10a, 10b, 10c, thus flexible manufacturing processes may be used.

More details and aspects are mentioned in connection with the embodiments described above or below. The embodiments shown in FIGS. 4a-4c may comprise one or more optional additional features corresponding to one or more aspects mentioned in connection with the proposed concept or one or more embodiments described above or below (e.g., FIGS. 1-3 and 5).

Figure 5:
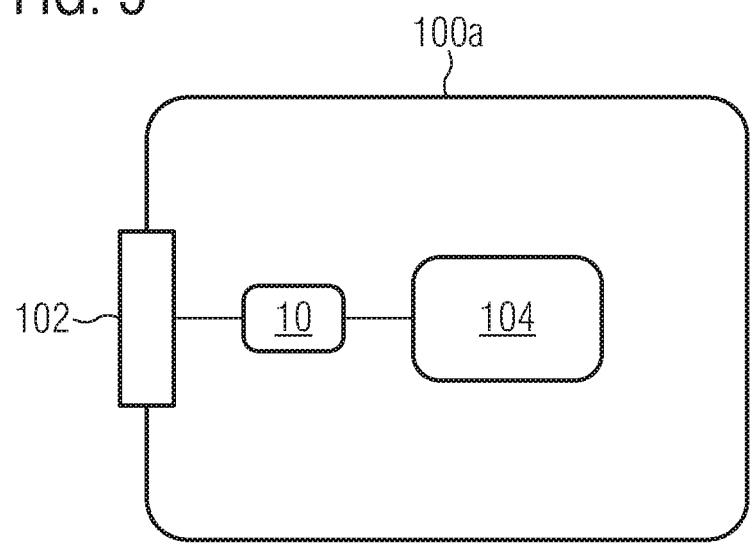
FIG. 5 shows a USB compatible device with an overvoltage protection circuit and a USB controller chip.

FIG. 5 shows a USB compatible device 100a comprising an overvoltage protection circuit 10 and a USB controller chip 104. The USB device 100a may be any USB compatible device (e.g., USB type-C compatible), e.g., a mobile device, a mobile phone, a laptop, a computer, or a monitor. The first terminal 12 of the overvoltage protection circuit 10 is coupled to a data pin of the interface 102, e.g., a configuration channel pin of a USB type-C interface. The second terminal 14 of the overvoltage protection circuit 10 is coupled to the USB controller chip 104 (e.g., a USB type-C controller).

More details and aspects are mentioned in connection with the embodiments described above or below. The embodiments shown in FIG. 5 may comprise one or more optional additional features corresponding to one or more aspects mentioned in connection with the proposed concept or one or more embodiments described above or below (e.g., FIGS. 1-4).

Examples relate to novel OVP (overvoltage protection) device concepts, e.g., with a GaN HEMT, e.g., to protect a USB type-C cc pin. An aspect relates to a passive device for OVP. By proposed concepts, a need of power supply for the overvoltage protection may be avoided, for example. For example, there might be no further power consumption for a battery-powered mobile device due to overvoltage protection. Proposed concepts may avoid problems due to dead battery scenario, for example. For example, overvoltage protection can be provided by using a simplified circuit and proposed concepts may be easy to use. No further high voltage periphery components may be needed and simplified PCB routings can be implemented, for example. Proposed concepts may be used for efficiently providing overvoltage protection at a power supply pin and/or at a data signal pin of a device interface, for example.

Some embodiments relate to a method for operating an overvoltage protection circuit for a device interface adapted to convey at least electrical energy. The overvoltage protection circuit comprises a first terminal, a second terminal and a normally-on transistor. A drain contact of the normally-on transistor is electrically coupled to the first terminal and a source contact of the normally-on transistor is electrically coupled to the second terminal. The method comprises switching off the normally-on transistor of the overvoltage protection circuit as a function of at least one of a voltage at the first terminal and a voltage at the second terminal.

More details and aspects are mentioned in connection with the embodiments described above or below.

Some embodiments relate to an overvoltage protection circuit for a device interface adapted to convey at least electrical energy, the overvoltage protection circuit comprising a first terminal and a second terminal; a normally-on transistor, wherein a drain contact of the normally-on transistor is electrically coupled to the first terminal and a source contact of the normally-on transistor is electrically coupled to the second terminal; and a control circuit configured to switch off the normally-on transistor as a function of at least one of a voltage at the first terminal and a voltage at the second terminal.

In some embodiments, the normally-on transistor is a gallium nitride transistor.

Alternatively, the normally-on transistor may be a depletion mode silicon field effect transistor.

In some examples, the control circuit is configured to switch off the normally-on transistor if a voltage at the first terminal or at the second terminal reaches or rises above a voltage threshold.

Optionally, the control circuit comprises a voltage detection circuit configured to provide a detection signal having a voltage level depending on whether the voltage at the first terminal or second terminal is above or below the voltage threshold.

In some examples, the voltage detection circuit comprises a diode and a voltage divider connected in series, wherein the detection signal is provided by the voltage divider.

Optionally, the diode is a Zener diode.

In some embodiments, the control circuit comprises a transistor for controlling a gate of the normally-on transistor, wherein a collector or a drain of the transistor is electrically coupled to the gate of the normally-on transistor.

In some examples, the voltage detection circuit is configured to provide the detection signal to a base or a gate of the transistor of the control circuit.

Optionally, the second terminal and the gate of the normally-on transistor are electrically coupled via a resistor.

In some examples, the normally-on transistor and the control circuit are implemented on a common semiconductor die.

Some embodiments relate to a device comprising an interface for conveying at least electrical energy; and an overvoltage protection circuit according to any one of the previous claims, wherein the first terminal of the overvoltage protection circuit is electrically coupled to the interface.

In some examples, the interface is configured for conveying both electrical energy and data.

Optionally, the interface is a Universal Serial Bus interface, the device further comprising a Universal Serial Bus controller, wherein the second terminal of the overvoltage protection circuit is electrically coupled to the Universal Serial Bus controller.

In some embodiments, the Universal Serial Bus controller is a Universal Serial Bus type-C controller and the interface is a Universal Serial Bus type-C interface adapted for conveying both electrical energy and data.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An overvoltage protection circuit for a device interface adapted to convey at least electrical energy, the overvoltage protection circuit comprising:
    a first terminal and a second terminal;
    a normally-on transistor, wherein a drain contact of the normally-on transistor is electrically coupled to the first terminal and a source contact of the normally-on transistor is electrically coupled to the second terminal; and
    a control circuit configured to switch off the normally-on transistor as a function of at least one of a voltage at the first terminal and a voltage at the second terminal,
    wherein the normally-on transistor is a gallium nitride transistor or a depletion mode silicon field effect transistor,
    wherein the control circuit comprises a transistor for controlling a gate of the normally-on transistor,
    wherein a collector or a drain of the transistor is electrically coupled to the gate of the normally-on transistor.

2. The overvoltage protection circuit of claim 1, wherein the control circuit is configured to switch off the normally-on transistor if at least one of the voltage at the first terminal and the voltage at the second terminal reaches or rises above a voltage threshold.

3. The overvoltage protection circuit of claim 1, wherein the control circuit comprises a voltage detection circuit configured to provide a detection signal having a voltage level depending on whether the voltage at the first terminal or the second terminal is above or below the voltage threshold.

4. The overvoltage protection circuit of claim 3, wherein the voltage detection circuit comprises a diode and a voltage divider connected in series, and wherein the detection signal is provided by the voltage divider.

5. The overvoltage protection circuit of claim 4, wherein the diode is a Zener diode.

6. The overvoltage protection circuit of claim 1, wherein the control circuit comprises a voltage detection circuit configured to provide a detection signal having a voltage level depending on whether the voltage at the first terminal or the second terminal is above or below the voltage threshold, and wherein the voltage detection circuit is configured to provide the detection signal to a base or a gate of the transistor of the control circuit.

7. The overvoltage protection circuit of claim 1, wherein the second terminal and a gate of the normally-on transistor are electrically coupled via a resistor.

8. The overvoltage protection circuit of claim 1, wherein the normally-on transistor and the control circuit are implemented on a common semiconductor die.

9. A device, comprising:
    an interface for conveying at least electrical energy; and
    the overvoltage protection circuit of claim 1,
    wherein the first terminal of the overvoltage protection circuit is electrically coupled to the interface.

10. The device of claim 9, wherein the interface is configured for conveying both electrical energy and data.

11. The device of claim 9, wherein the interface is a Universal Serial Bus (USB) interface,
    the device further comprising:

a USB controller,
wherein the second terminal of the overvoltage protection circuit is electrically coupled to the USB controller.

12. The device of claim 11, wherein the USB controller is a USB type-C controller and the interface is a USB type-C interface adapted for conveying both electrical energy and data.

13. The device of claim 9, wherein the transistor is a bipolar transistor or a field effect transistor.

14. The device of claim 9, wherein the control circuit contacts a gate of the normally-on transistor.

15. The overvoltage protection circuit of claim 1, wherein the transistor is a bipolar transistor or a field effect transistor.

16. The overvoltage protection circuit of claim 1, wherein the control circuit contacts a gate of the normally-on transistor.

17. An overvoltage protection circuit for a device interface adapted to convey at least electrical energy, the overvoltage protection circuit comprising:
a first terminal and a second terminal;
a normally-on GaN high electron mobility transistor (HEMT), wherein a drain contact of the normally-on GaN HEMT is electrically coupled to the first terminal and a source contact of the normally-on GaN HEMT is electrically coupled to the second terminal such that the normally-on GaN HEMT is the only device configured to electrically isolate the first terminal and the second terminal from one another; and
a control circuit configured to switch off the normally-on GaN HEMT as a function of at least one of a voltage at the first terminal and a voltage at the second terminal.

18. The overvoltage protection circuit of claim 17, wherein the control circuit comprises a transistor for controlling a gate of the normally-on transistor, and wherein a collector or a drain of the transistor is electrically coupled to the gate of the normally-on transistor.

19. The overvoltage protection circuit of claim 18, wherein the control circuit comprises a voltage detection circuit configured to provide a detection signal having a voltage level depending on whether the voltage at the first terminal or the second terminal is above or below the voltage threshold, and wherein the voltage detection circuit is configured to provide the detection signal to a base or a gate of the transistor of the control circuit.

20. An overvoltage protection circuit for a device interface adapted to convey at least electrical energy, the overvoltage protection circuit comprising:
a first terminal and a second terminal;
a normally-on depletion mode silicon field effect transistor, wherein a drain contact of the the normally-on depletion mode silicon field effect transistor is electrically coupled to the first terminal and a source contact of the normally-on depletion mode silicon field effect transistor is electrically coupled to the second terminal such that the normally-on depletion mode silicon field effect transistor is the only device configured to electrically isolate the first terminal and the second terminal from one another; and
a control circuit configured to switch off the normally-on depletion mode silicon field effect transistor as a function of at least one of a voltage at the first terminal and a voltage at the second terminal.

21. The overvoltage protection circuit of claim 20, wherein the control circuit comprises a transistor for controlling the gate of the normally-on depletion mode silicon field effect transistor.

22. The overvoltage protection circuit of claim 21, wherein the control circuit comprises a voltage detection circuit configured to provide a detection signal having a voltage level depending on whether the voltage at the first terminal or the second terminal is above or below the voltage threshold, and wherein the voltage detection circuit is configured to provide the detection signal to a base or a gate of the transistor of the control circuit.

\* \* \* \* \*

UNITED STATES PATENT AND TRADEMARK OFFICE
CERTIFICATE OF CORRECTION

| | |
|---|---|
| PATENT NO. | : 11,791,624 B2 |
| APPLICATION NO. | : 17/154562 |
| DATED | : October 17, 2023 |
| INVENTOR(S) | : Fang et al. |

It is certified that error appears in the above-identified patent and that said Letters Patent is hereby corrected as shown below:

In the Claims

Column 16, Line 12 (Claim 20, Line 6) please change "of the the" to -- of the --

Signed and Sealed this
Thirtieth Day of January, 2024

Katherine Kelly Vidal
*Director of the United States Patent and Trademark Office*